(12) United States Patent
Nam

(10) Patent No.: US 7,355,243 B2
(45) Date of Patent: Apr. 8, 2008

(54) FLASH MEMORY DEVICE AND METHOD FOR FABRICATING THE SAME

(75) Inventor: Sang Woo Nam, Chungcheongbuk-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/320,862

(22) Filed: Dec. 30, 2005

(65) Prior Publication Data
US 2007/0020846 A1    Jan. 25, 2007

(30) Foreign Application Priority Data
Jul. 21, 2005   (KR)  .................... 10-2005-0066419

(51) Int. Cl.
*H01L 29/788*    (2006.01)
(52) U.S. Cl. ............................. 257/316; 257/E27.078
(58) Field of Classification Search ........ 257/316–321, 257/E27.078
See application file for complete search history.

(56) References Cited

U.S. PATENT DOCUMENTS

| 4,852,062 A | * | 7/1989 | Baker et al. | 365/185.15 |
| 5,736,442 A | * | 4/1998 | Mori | 438/257 |
| 5,741,719 A | * | 4/1998 | Kim | 438/257 |
| 6,207,504 B1 | * | 3/2001 | Hsieh et al. | 438/264 |
| 6,673,674 B2 | * | 1/2004 | Inoue et al. | 438/257 |

* cited by examiner

*Primary Examiner*—Richard A. Booth
(74) *Attorney, Agent, or Firm*—Lowe Hauptman Ham & Berner LLP

(57) ABSTRACT

A flash memory device including an isolation layer for defining active regions in a semiconductor substrate. The active region is a region in which flash memory cells are to be formed. The device also includes a gate stack is formed to come across the active region and the isolation layer, and a sidewall spacer is formed at sidewalls of the gate stack. The device further includes a common source line that electrically interconnects a plurality of sources of a plurality of the flash memory cells, and is formed in the isolation layer by removing an insulating material in the isolation layer and is formed in parallel to a word line formed over the gate stack. A silicide layer is formed in the common source line.

3 Claims, 28 Drawing Sheets

FLASH MEMORY DEVICE AND METHOD FOR FABRICATING THE SAME

This application claims priority to and the benefit of Korean Patent Application No. 10-2005-0066419 filed in the Korean Intellectual Property Office on Jul. 21, 2005, the entire contents of which are incorporated herein by reference.

BACKGROUND OF THE INVENTION

1. Field of the Invention

The present invention relates to semiconductor technologies, and more specifically, to a nonvolatile flash memory device and manufacturing method for the same.

2. Description of the Related Art

Flash memory, which is capable of retaining the stored data without continued supply of electrical power, has a stacked gate structure of a floating gate and a control gate. The floating gate, which is placed between the control gate and the semiconductor substrate, is isolated by an insulating oxide layer. When electrons are on the floating gate, they modify the electric field coming from the control gate, which modifies the threshold voltage of the cell. Thus, when the flash memory cell is "read" by applying a specific voltage to the control gate, electrical current will either flow or not flow, depending on the threshold voltage of the cell, which is controlled by the electrons on the floating gate. The presence or absence of current is sensed and translated into 1's and 0's, reproducing the stored data. The flash memory device is classified, according to its cell structure, into two classifications: NOR flash and NAND flash. The NAND flash has higher integration and is suitable for use in electronic devices requiring high storage capacity. The NOR flash memory allows higher speed and random access to the memory cells but it requires a space for the each of memory cells being interconnected to bit line and has relatively low integrity. For increasing the integrity of a cell array, the source regions of NOR memory cells are electrically interconnected in parallel to a word line to form a common source line. With the common source line, a plurality of memory cells have one common contact point, and thus the integrity of a NOR memory cell array can be improved by decreasing the intervals between common contact points.

FIG. 1A is a plan view of the conventional flash memory device and FIGS. 1B to 1D are cross sectional views of FIG. 1A taken along the lines I-I, II-II and III-III, respectively.

Referring to FIGS. 1A to 1D, the conventional flash memory device has an isolation layer 12 for defining active regions in a semiconductor substrate 10, and a plurality of word lines 22 crossing the active regions and the isolation layer 12. Under the word line 22, a stacked structure 22a of a tunnel oxide layer 14, a floating gate 16, a dielectric layer 18 and a control gate 20 is formed. At the sidewalls of the gate stack 22a, spacers 24 are formed. At both sides of the word line 22, source region 26 and drain region 23 are formed. The source region 26 is formed by removing insulating material in the isolation layer 12 and then implanting dopants into the substrate at the isolation layer so that source regions of a plurality of memory cells are interconnected by the source line 26

In the formation of the source line 26, an inclined ion implantation method is used for ensuring the uniform implantation of dopants. In this process, the dopants may be injected into the gate stack 22a, which may degrade the device characteristics. Furthermore, parts of the active region may be recessed during the removal of insulating material in the isolation layer, which may cause accumulated stress at the substrate and an increase of leakage current due to defects in channel regions that neighbor the source line 26.

SUMMARY OF THE INVENTION

It is an object of the present invention to prevent the problems of conventional flash memory devices that can occur during the formation of a common source line.

In a first aspect, embodiments of the present invention are directed to a flash memory device comprising: an isolation layer for defining active regions in a semiconductor substrate, the active region being a region in which flash memory cells are to be formed; a gate stack formed to come across the active region and the isolation layer; a sidewall spacer formed at sidewalls of the gate stack; a common source line for electrically interconnecting a plurality of sources of a plurality of the flash memory cells, the common source line being formed in the isolation layer by removing an insulating material in the isolation layer and formed in parallel to a word line formed over the gate stack; and a silicide layer formed in the common source line.

In a second aspect, embodiments of the present invention are directed to a method for manufacturing a flash memory device, comprising the steps of: forming an isolation layer for defining active regions in a semiconductor substrate, the active region being a region in which flash memory cells are to be formed; forming a gate stack that comes across the active region and the isolation layer; forming source and drain regions at both sides of the gate stack; removing insulating material in the isolation layer that is near to the source regions to form a common source line which is parallel to a word line formed over the gate stack; and forming a silicide layer in the common source line. The step of forming the common source line comprises the steps of: depositing a conformal spacer insulating material on the entire surface of the semiconductor substrate; recessing the deposited spacer insulating material on the source regions; and selectively etching the spacer insulating material to form sidewall spacers at sidewalls of the gate stack. The spacer insulating material, formed by silicon nitride, has an etch selectivity to the isolation layer and the step of removing the insulating material in the isolation layer is carried out with reference to the sidewall spacers.

These and other aspects of embodiments of the invention will become evident by reference to the following description of embodiments, often referring to the accompanying drawings.

DETAILED DESCRIPTION OF EMBODIMENTS OF THE INVENTION

Hereinafter, preferred embodiments of the present invention will be described with reference to the accompanying drawings.

Figure 1A:
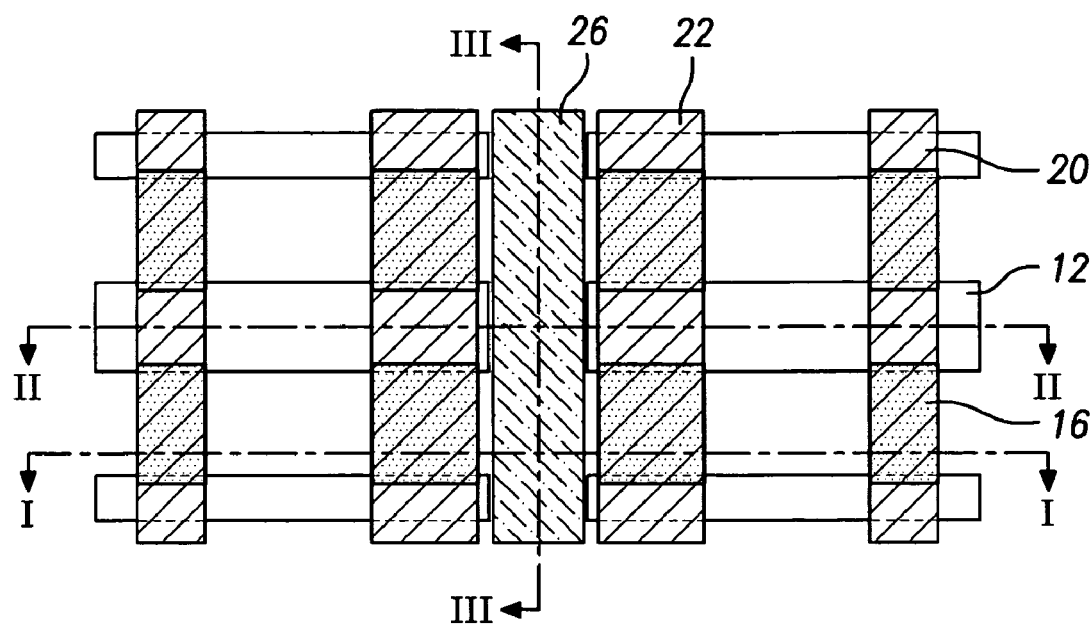
FIG. 1A is a plan view of the conventional flash memory device and FIGS. 1B to 1D are cross sectional views of FIG. 1A taken along the lines I-I, II-II and III-III, respectively, depicted in FIG. 1A.
Figure 1B:
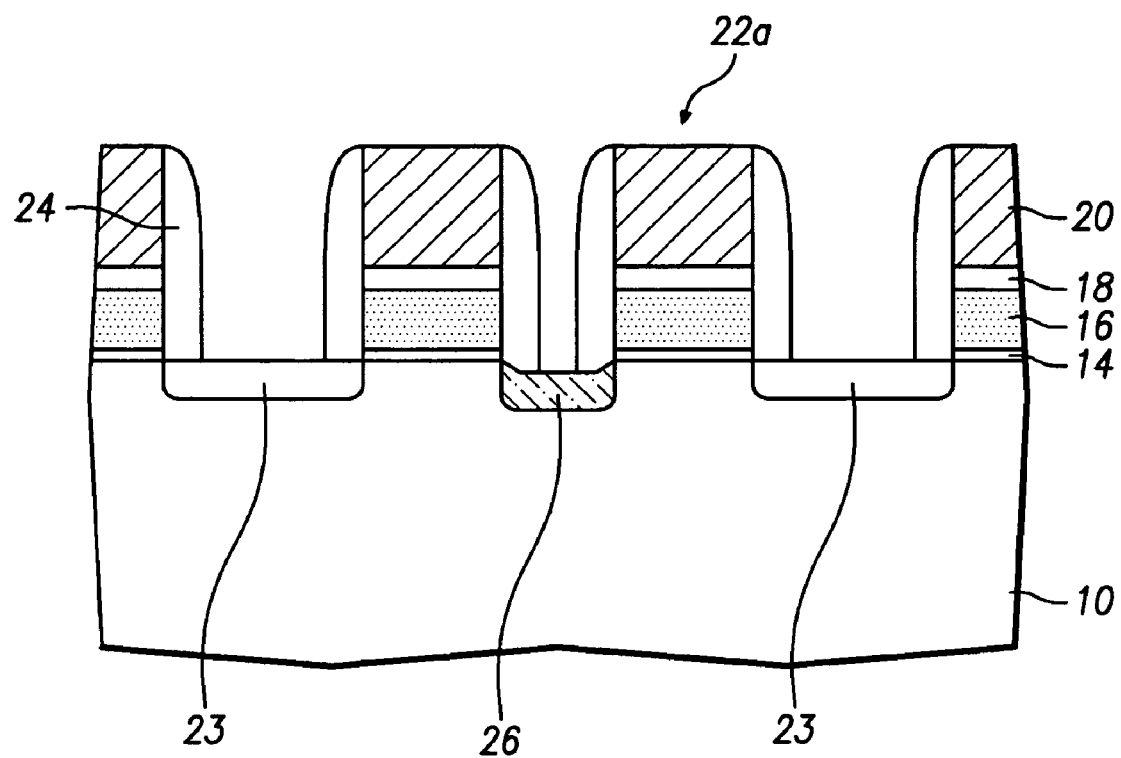
Figure 1C:
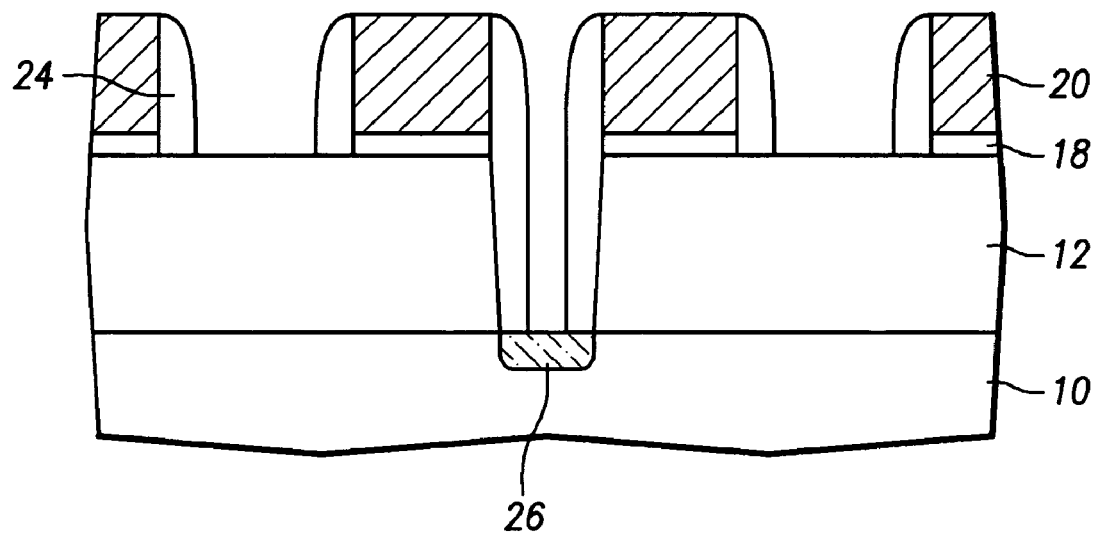
Figure 1D:
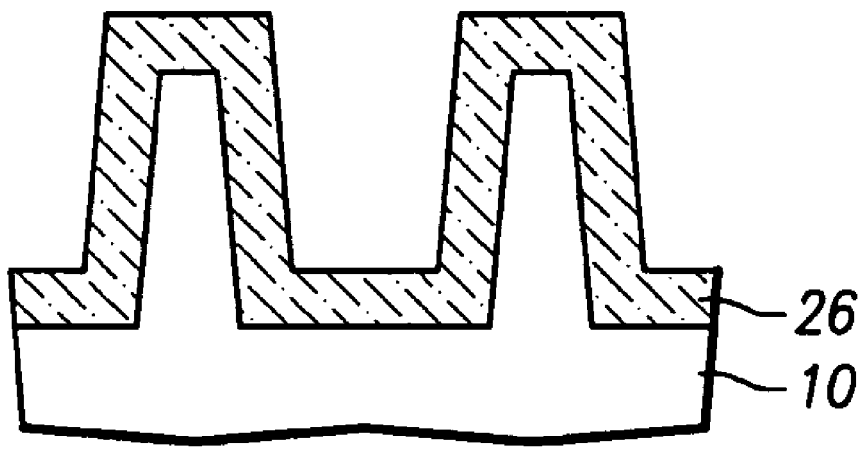
Figure 2A:
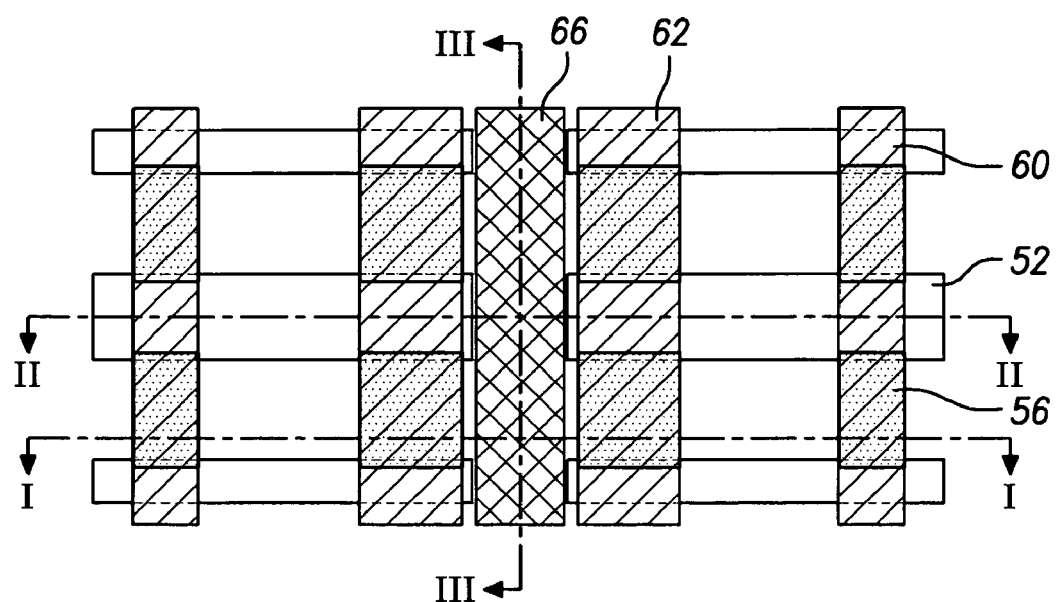
FIG. 2A is a plan view of a flash memory device according to the present invention and FIGS. 2B to 2D are cross sectional views of FIG. 2A taken along the lines I-I, II-II and III-III, respectively, depicted in FIG. 2A.
Figure 2B:
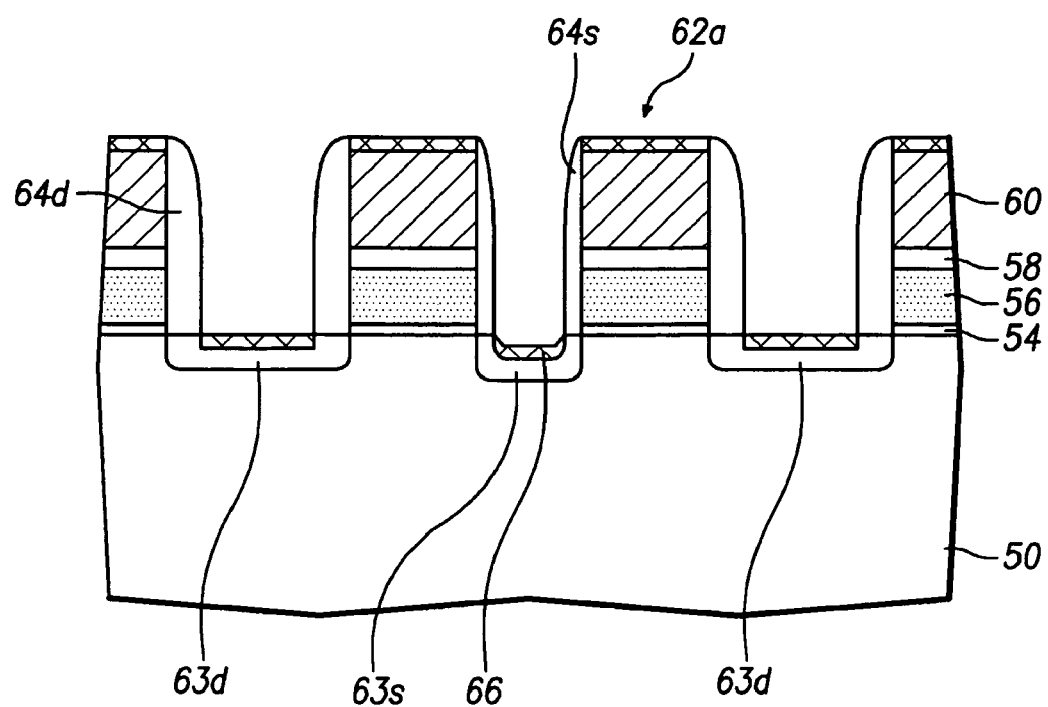
Figure 2C:
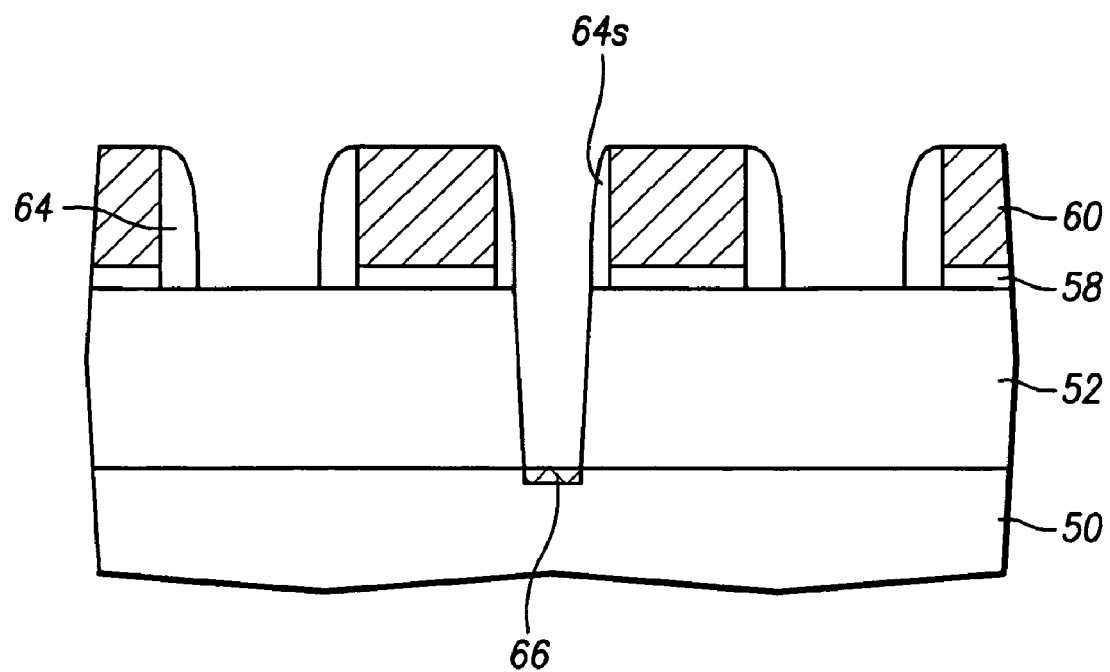
Figure 2D:
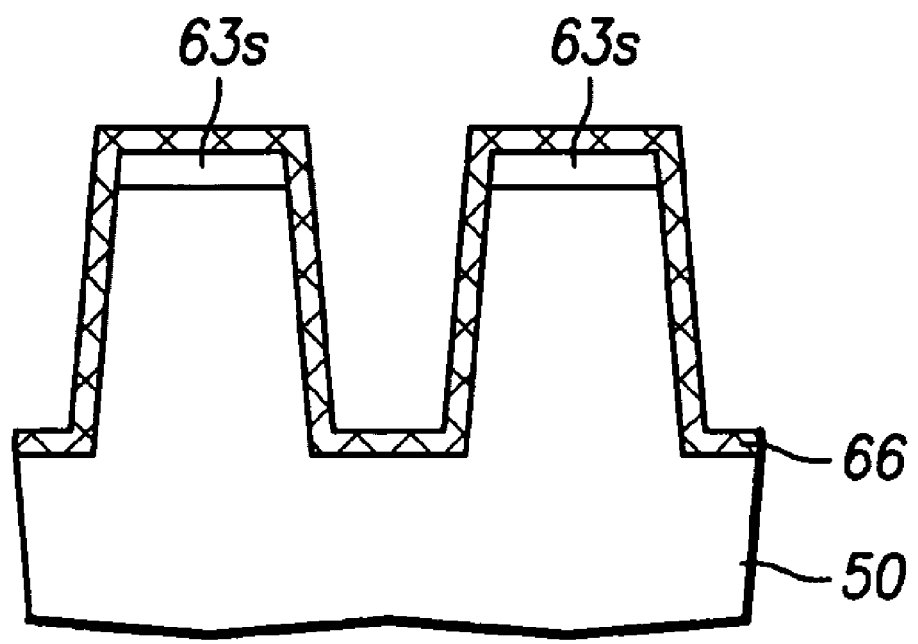
Figure 3A:
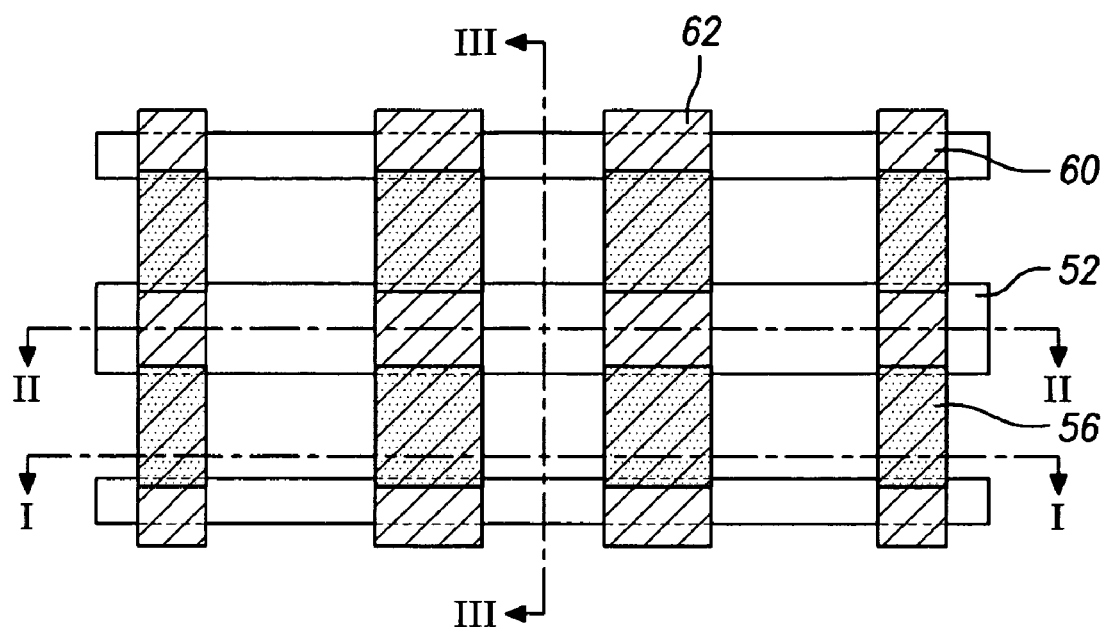
FIG. 3A is a plan view for illustrating a first stage of a method of fabricating a flash memory device according to an embodiment of the present invention and FIGS. 3B to 3D are cross sectional views of FIG. 3A taken along the lines I-I, II-II and III-III, respectively, depicted in FIG. 3A.
Figure 3B:
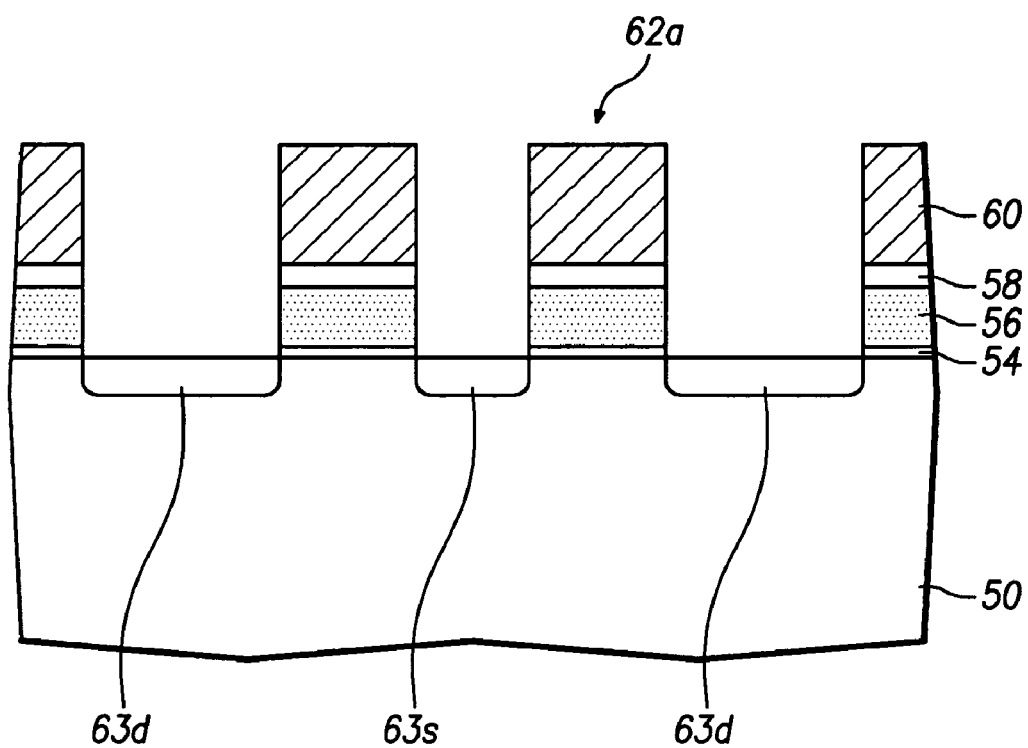
Figure 3C:
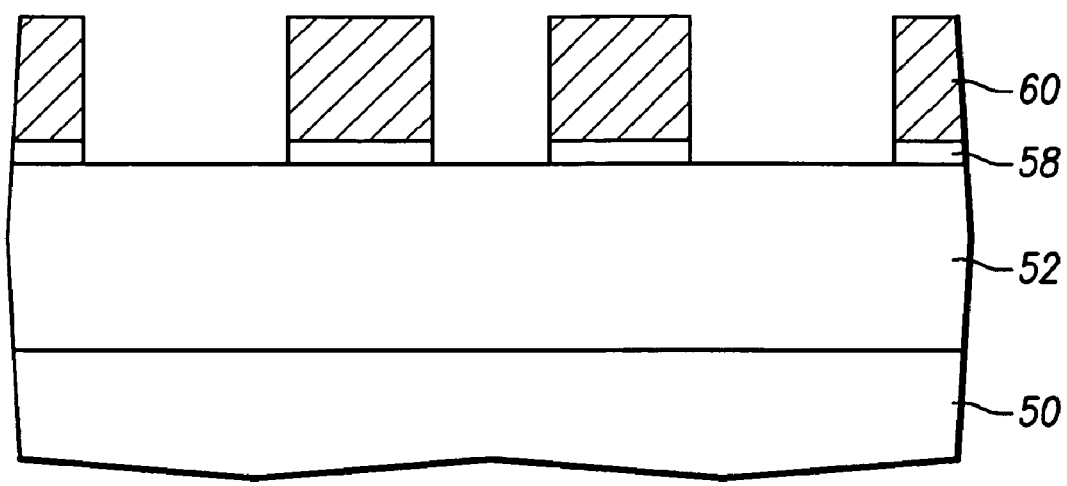
Figure 3D:
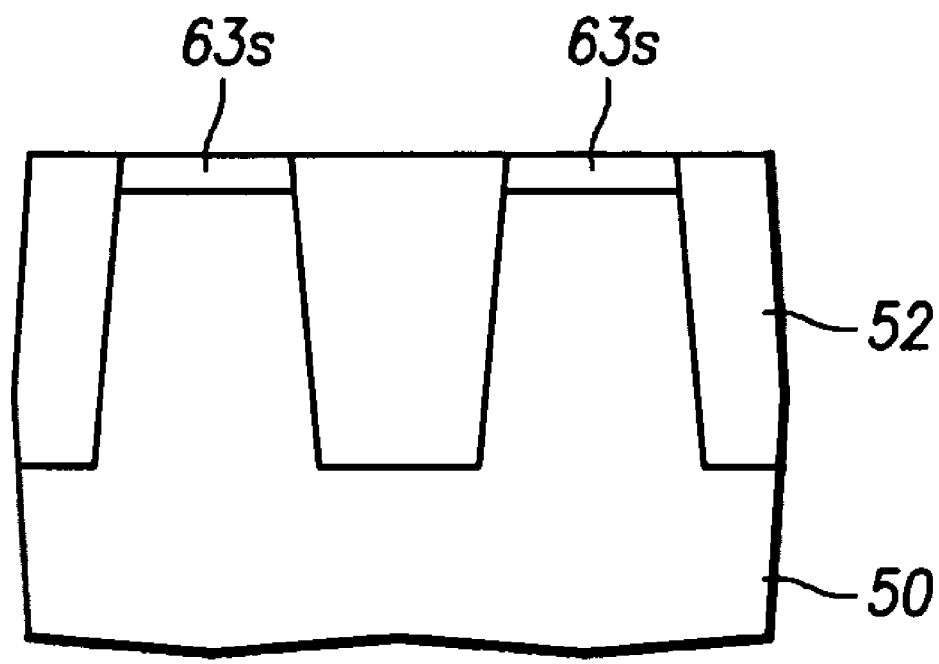
Figure 4A:
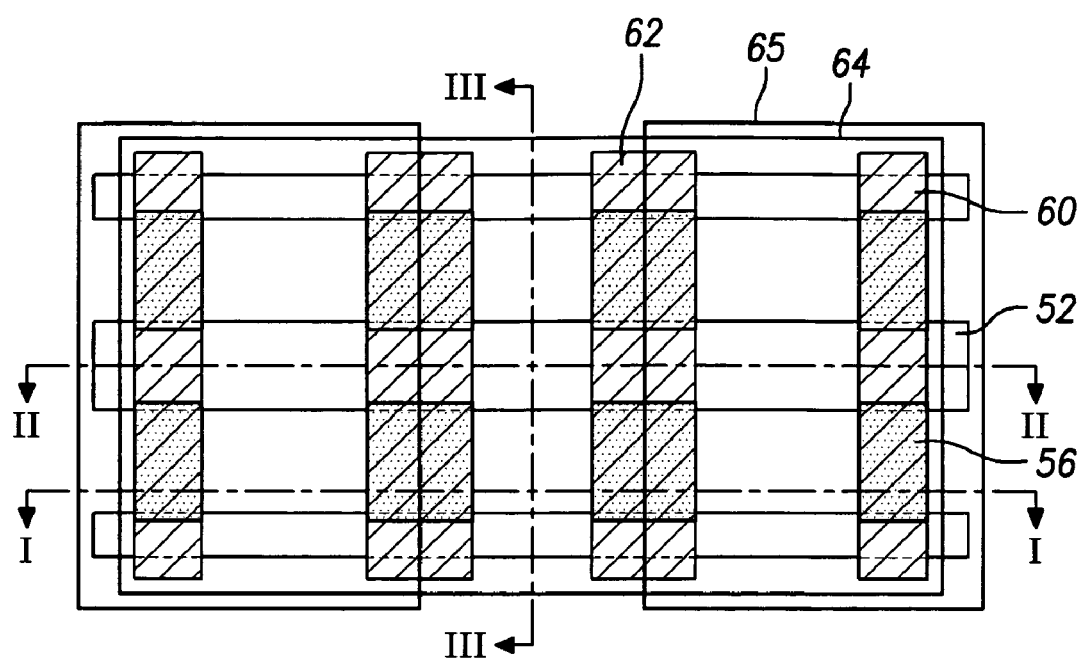
FIG. 4A is a plan view for illustrating a second stage of method of fabricating a flash memory device according to the embodiment of the present invention and FIGS. 4B to 4D are cross sectional views of FIG. 4A taken along the lines I-I, II-II and III-III, respectively, depicted in FIG. 4A.
Figure 4B:
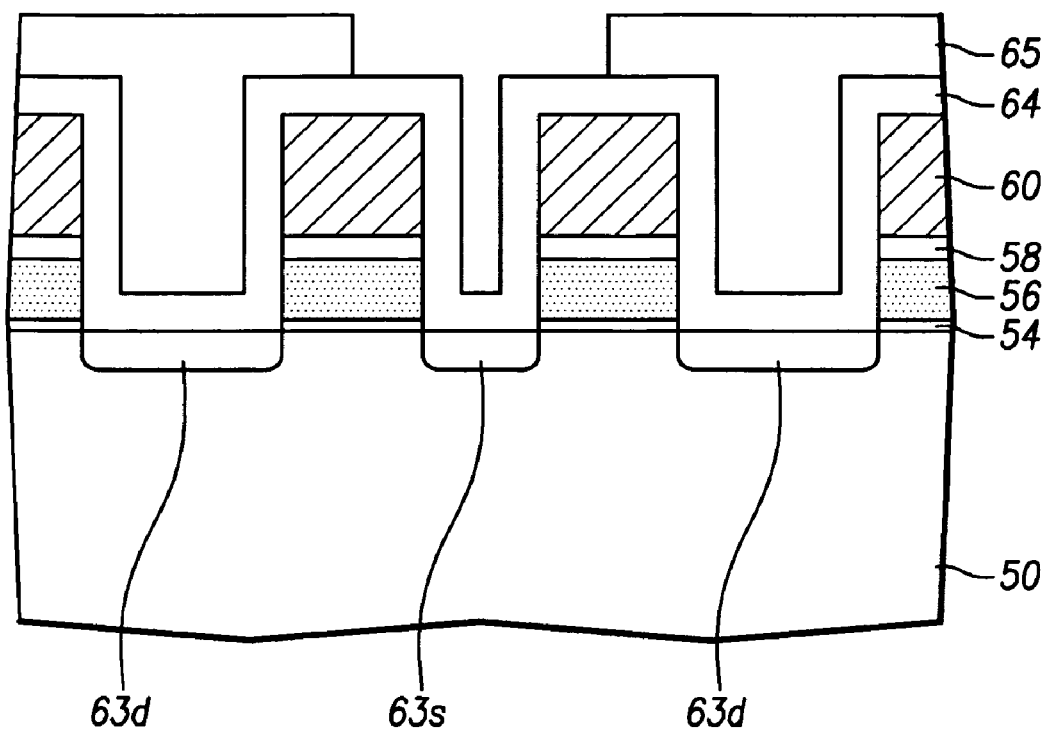
Figure 4C:
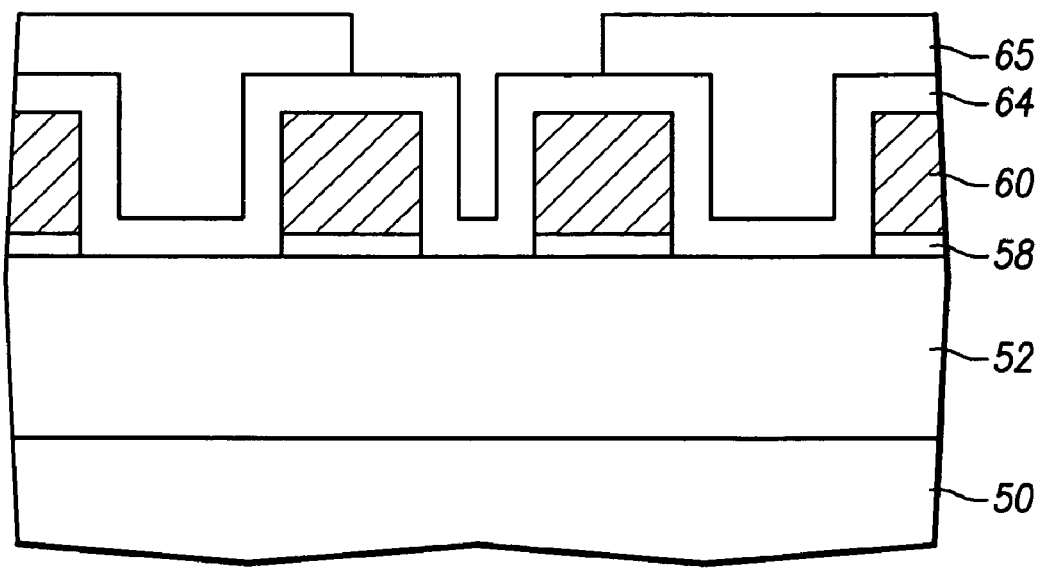
Figure 4D:
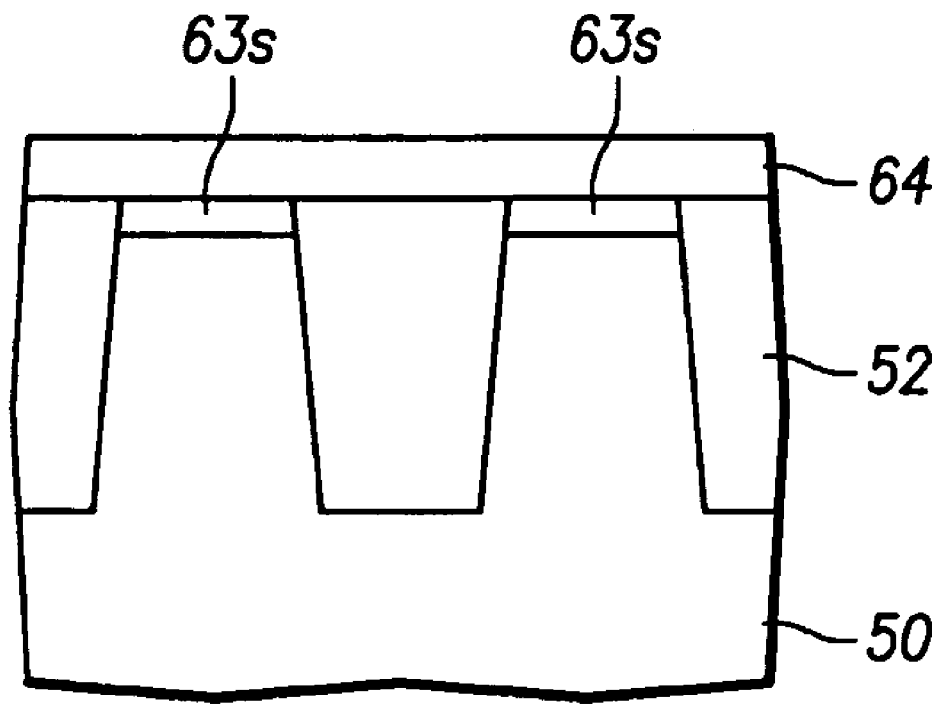
Figure 5A:
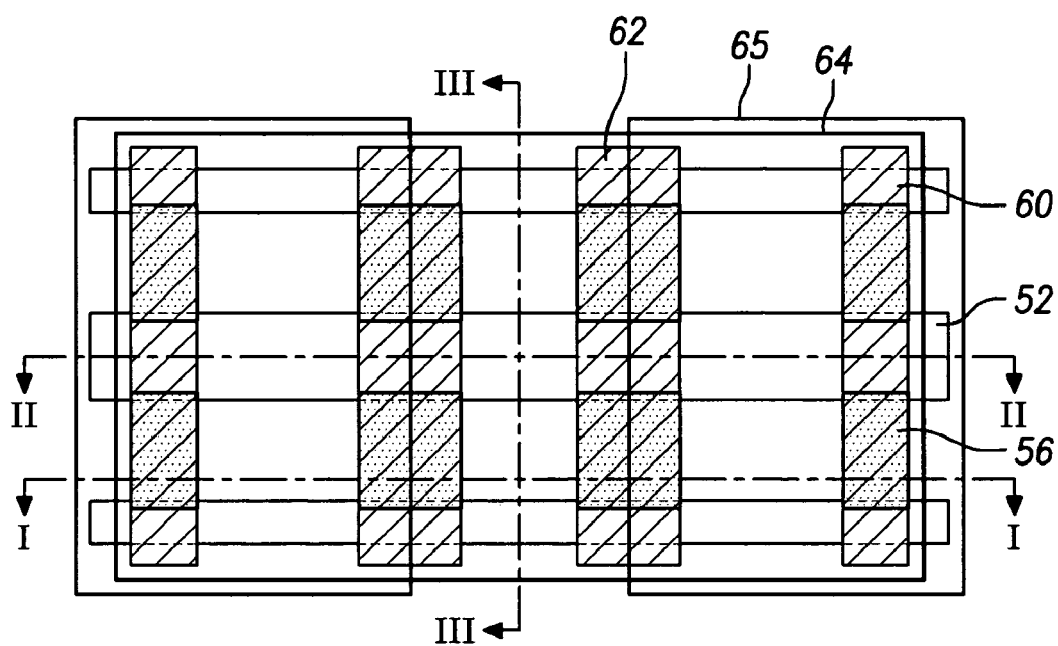
FIG. 5A is a plan view for illustrating a third stage of a method of fabricating a flash memory device according to the embodiment of the present invention and FIGS. 5B to 5D are cross sectional views of FIG. 5A taken along the lines I-I, II-II and III-III, respectively, depicted in FIG. 5A.
Figure 5B:
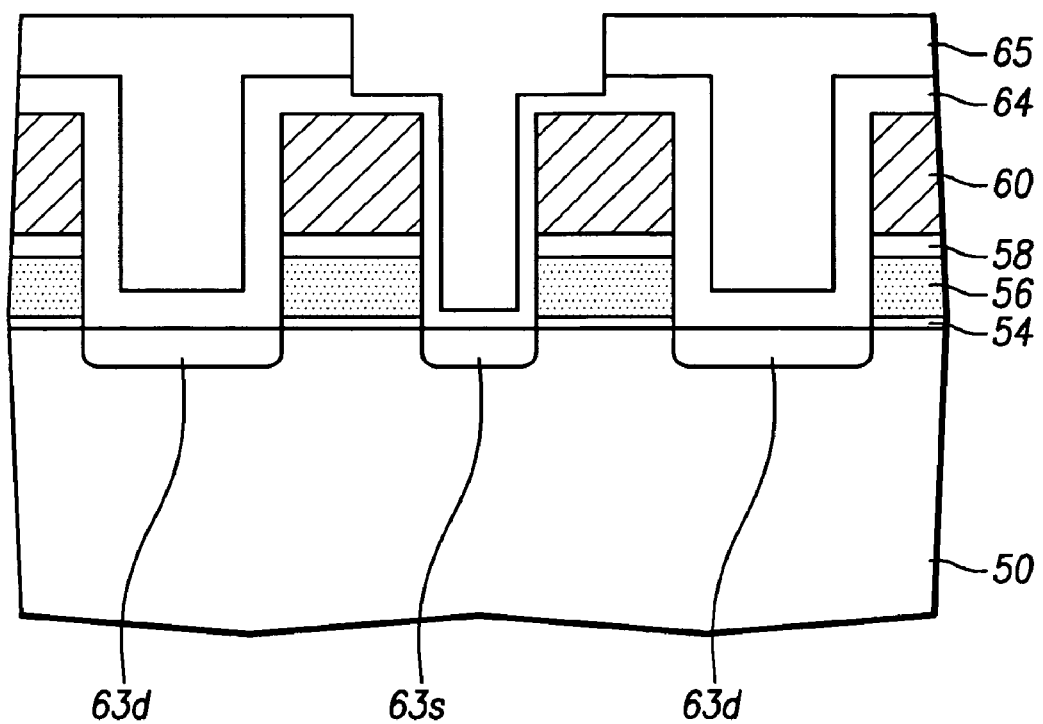
Figure 5C:
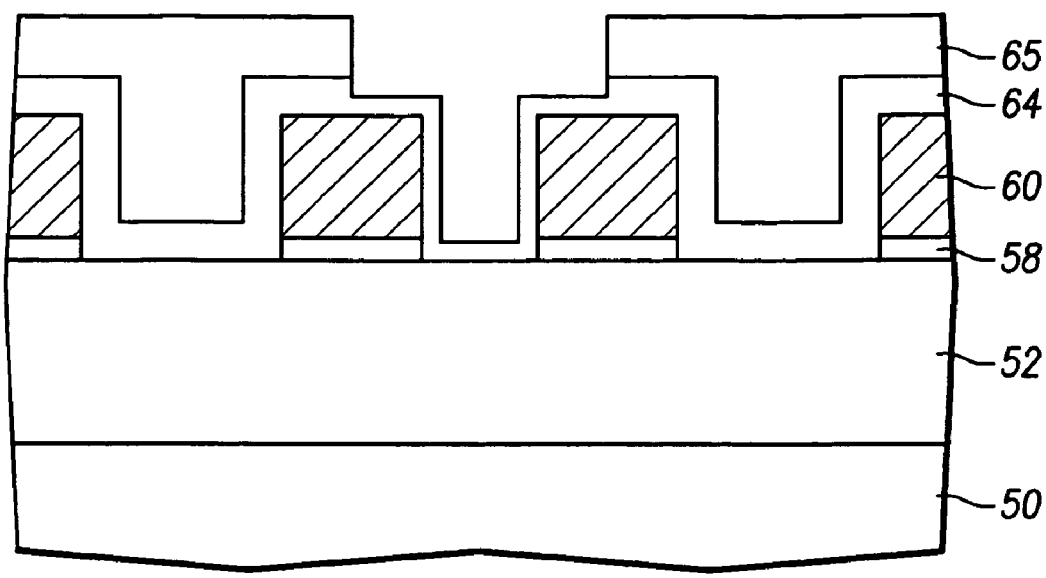
Figure 5D:
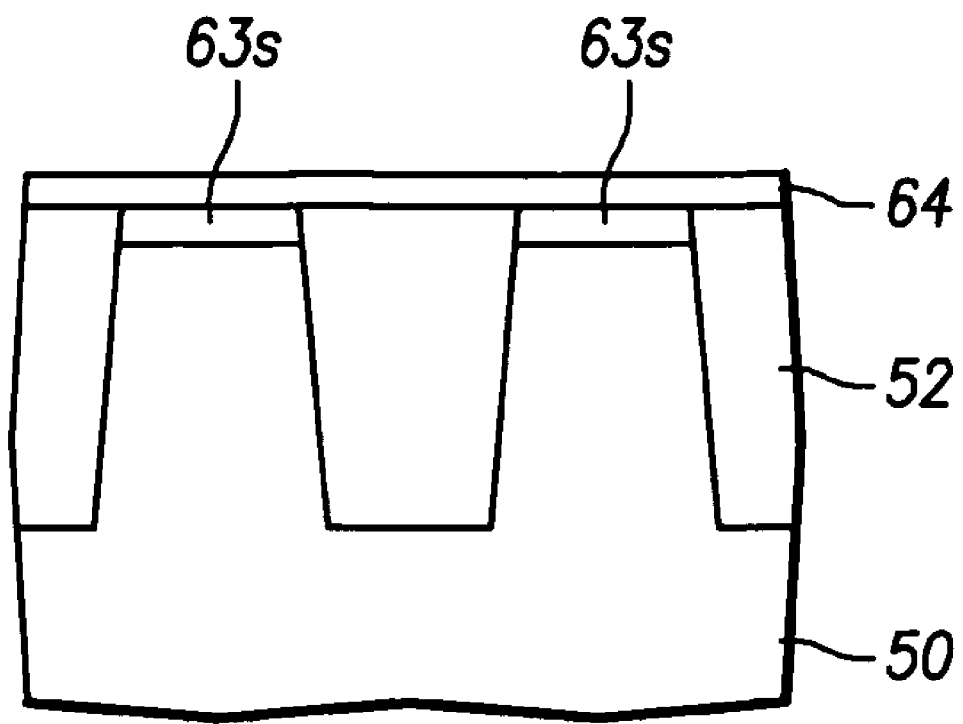
Figure 6A:
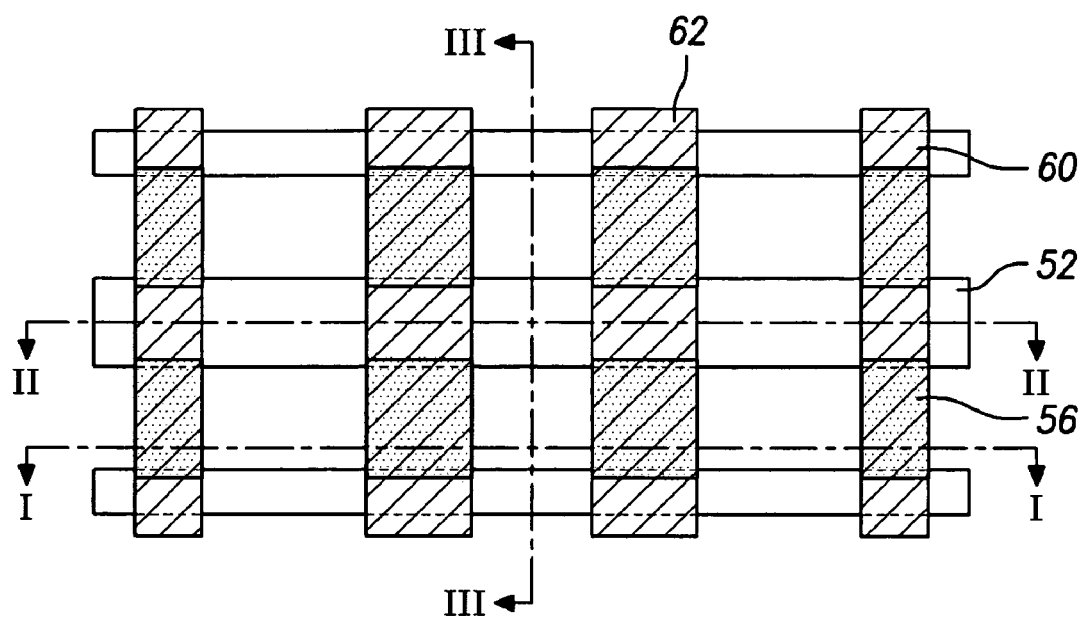
FIG. 6A is a plan view for illustrating a fourth stage of a method of fabricating a flash memory device according to the embodiment of the present invention and FIGS. 6B to 6D are cross sectional views of FIG. 6A taken along the lines I-I, II-II and III-III, respectively, depicted in FIG. 6A.
Figure 6B:
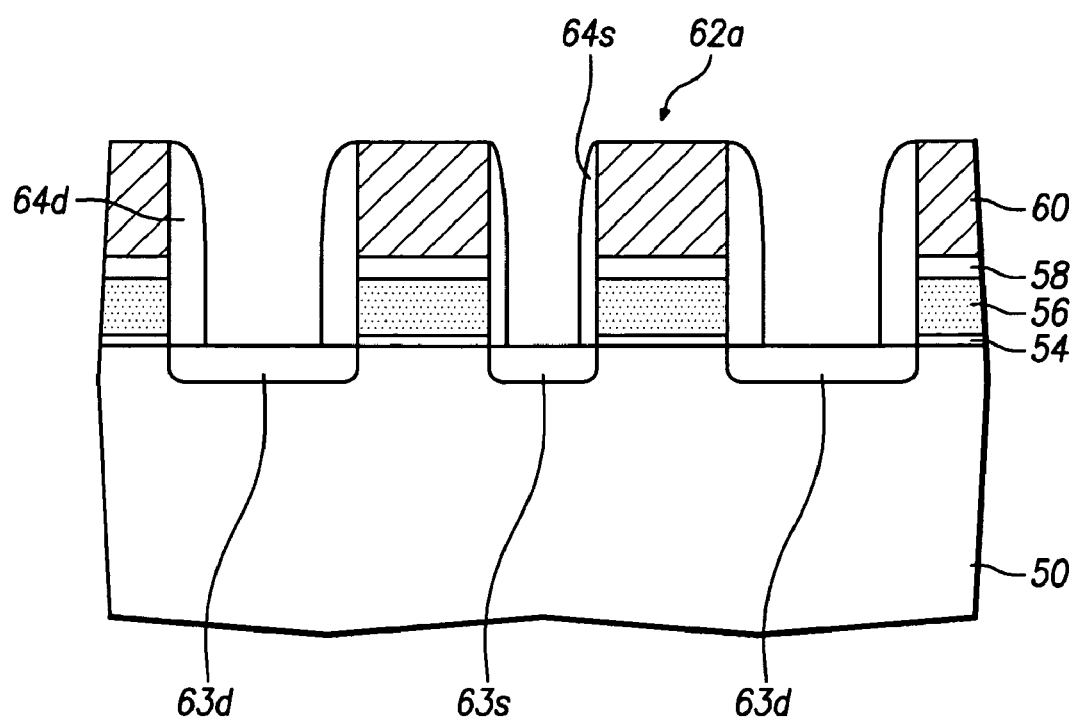
Figure 6C:
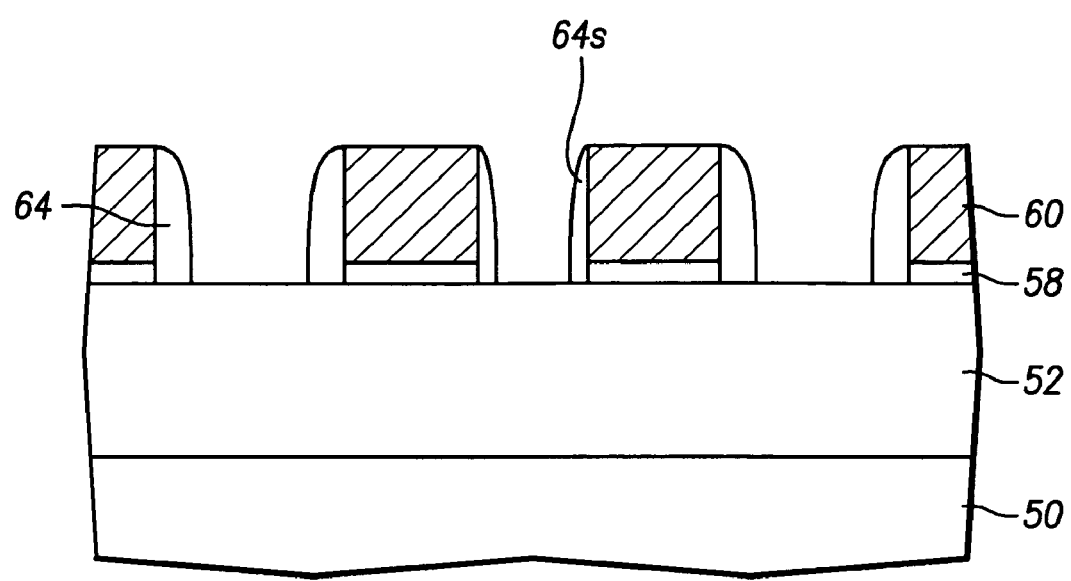
Figure 6D:
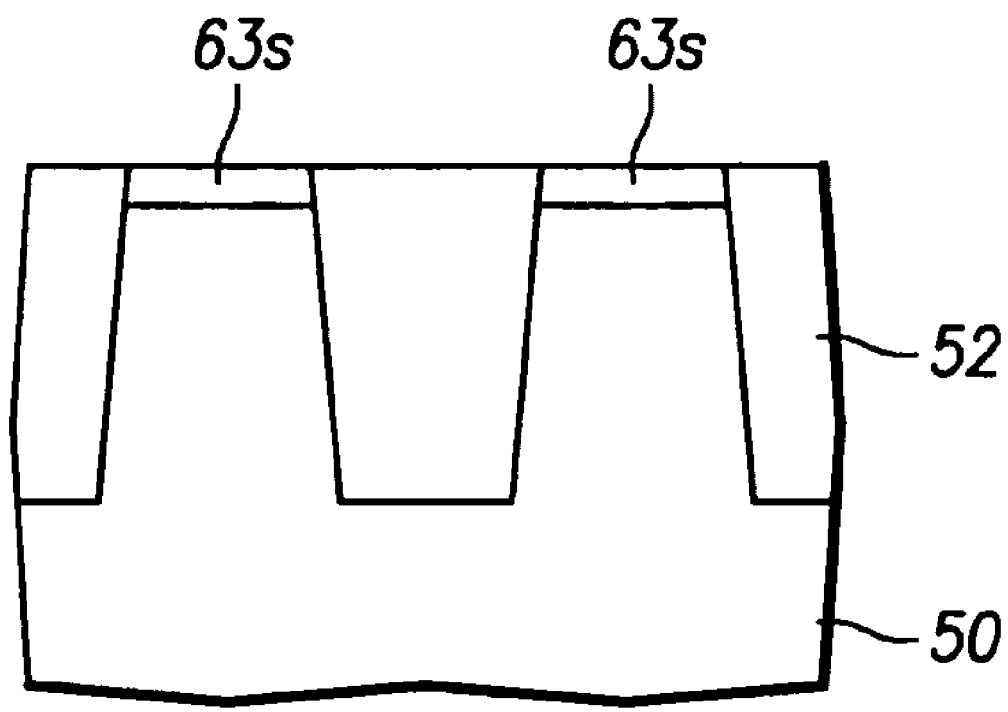
Figure 7A:
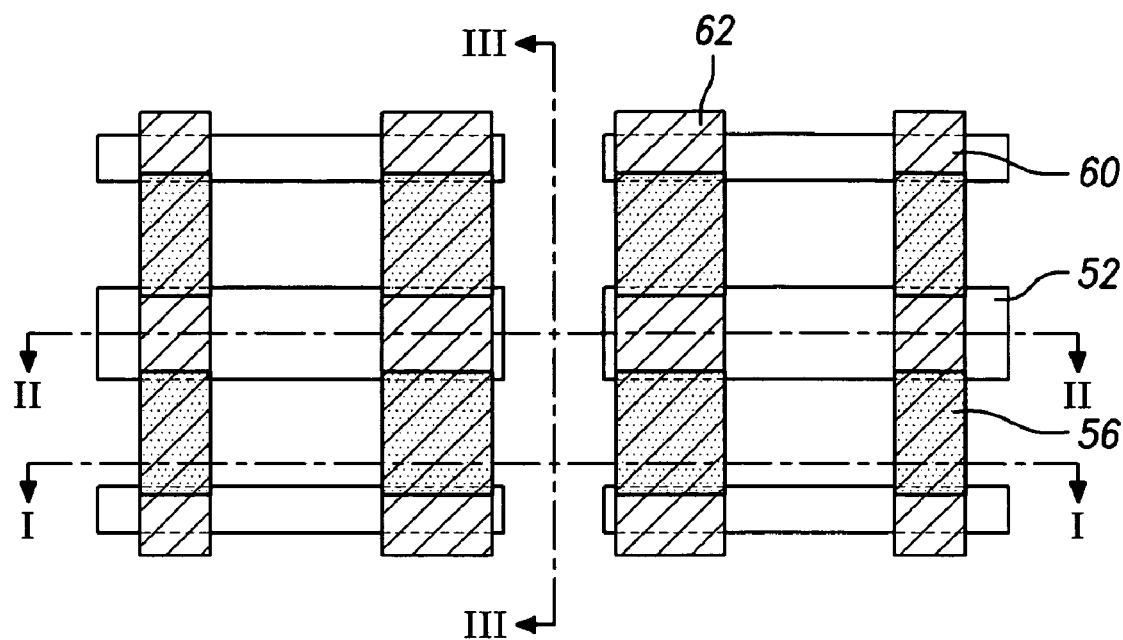
FIG. 7A is a plan view for illustrating a fifth stage of a method of fabricating a flash memory device according to the embodiment of the present invention and FIGS. 7B to 7D are cross sectional views of FIG. 7A taken along the lines I-I, II-II and III-III, respectively, depicted in FIG. 7A.
Figure 7B:
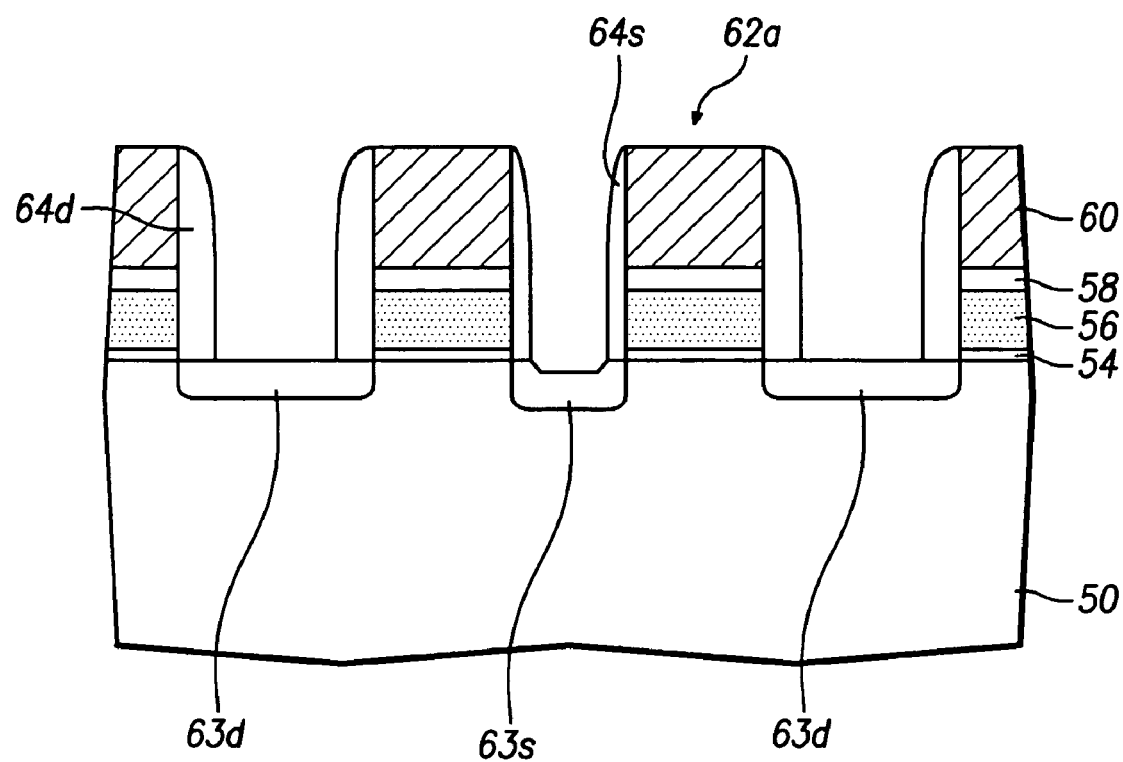
Figure 7C:
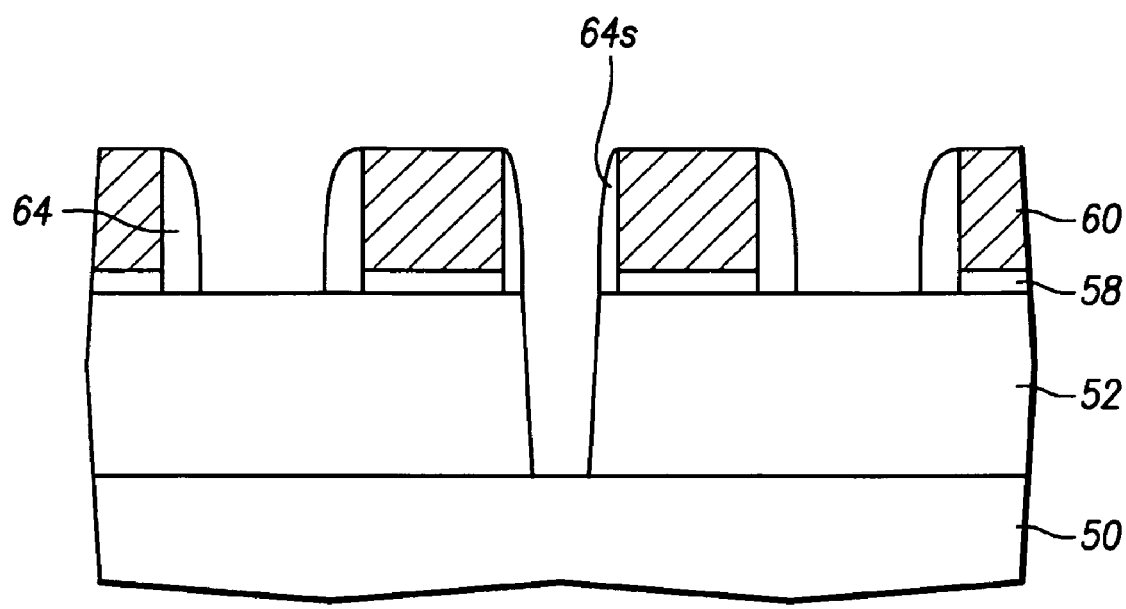
Figure 7D:
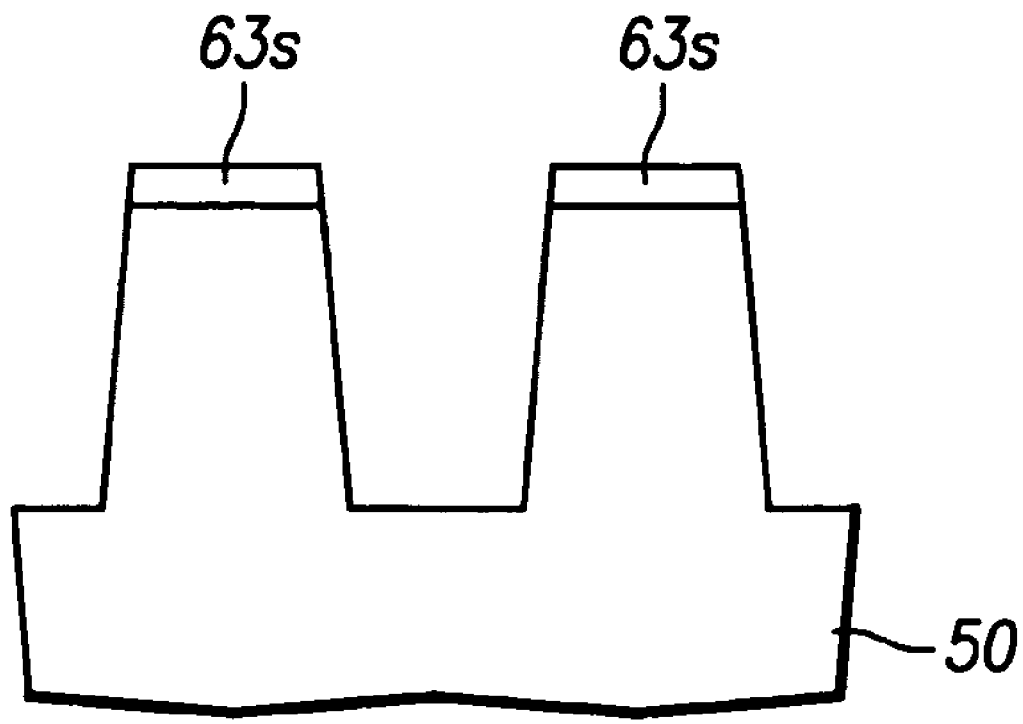

FIG. 2A is a plan view of a flash memory device according to the present invention and FIGS. 2B to 2D are cross sectional views of FIG. 2A taken along the lines I-I, II-II and III-III, respectively.

Referring to FIGS. 2A to 2D, a flash memory device of the present invention includes active regions separated by isolation layers 52 and a plurality of word lines 62 crossing the active regions and isolation layers 52. Under the word line 62, a stacked structure 62a of a tunnel oxide layer 54, a floating gate 56, a dielectric layer 58 and a control gate 60 is formed. At both sides of the word line 62, source region 63s and drain region 63d are formed. The isolation layer 52 is disconnected by the source region 63s. The flash memory cell has a silicide layer 66 disposed in parallel with the word line 62. The silicide layer 62 constitutes a common source line for a plurality of memory cells by interconnecting the source lines of the memory cells.

At the side walls of the stacked structure 62a, a spacer 64s is formed. The spacer 64s has a thinner portion that is closer to the source region 63s, and thus it is possible to reduce the electrical resistance of silicide layer 66 formed in the substrate and aligned with reference to the spacer 64s. The source region 63s has lower recess than the drain region 63d, which has sidewall spacers 64d on both sides thereof. The recess region of the source region 63s is aligned with reference to the sidewall spacer 64s and apart from the stacked structure 62a, and therefore even when the recess region has defects, the leakage current from the edge portion of cell transistor can be prevented.

FIGS. 3A to 7A are plan views for illustrating methods for fabricating a flash memory device according to an embodiment of the present invention, and FIGS. 3B to 7B, 3C to 7C and 3D to 7D are cross sectional views of FIGS. 3A to 7A taken along the lines I-I, II-II and III-III, respectively.

Referring to FIGS. 3A to 3D, isolation layers 52 are formed on a semiconductor substrate 50 to define active regions in which flash memory cells are to be formed, and then gate stack 62a is formed. The gate stack 62a is comprised of tunnel oxide layer 54, floating gate 56, dielectric layer 58 and control gate 60. The floating gate 56 is formed on the active region and the control gate 60 comes across the active region and the isolation layer.

A source region 63s and a drain region 63d are formed at both sides of the word line 62.

Referring to FIGS. 4A to 4D, an insulating material 64 is deposited on the entire surface of the substrate. The insulating material 64 has an etch selectivity to the isolation layer 52 and can be formed by, e.g., silicon nitride. The insulating material 64 is for forming a spacer and is formed conformal. Next, a first photoresist 65 is deposited on the spacer insulating material 64. The first photoresist 65 is patterned to have open regions on the source region 63s. The open regions of the first photoresist 65 are formed in parallel to the word line 62 to make parts of the deposited insulating material 64 to be exposed. The boundary of the open region has to overlap the word line in order to assure the alignment margin of the photolithographic process.

Referring to FIGS. 5A to 5D, the spacer insulating material 64 is selectively recessed with using the first photoresist layer 65 as an etch mask. The depth of the recess can be adjusted in consideration of the thickness of sidewall spacers that is to be formed at sidewalls of the gate stack.

Referring to FIGS. 6A to 6D, the first photoresist layer 65 is removed, and the insulating material 64 is anisotropically etched to form the sidewall spacers on the sidewalls of the gate stack. The sidewall spacers 64s, which are adjacent to the source region 63s, are smaller in thickness than the sidewall spacers 64d, which are adjacent to the drain region 63d.

Referring to FIGS. 7A to 7D, a second photoresist layer 65 (not shown in FIGS. 7A to 7D, but see FIGS. 4A to 4D and 5A to 5D) that has the same opening structure as the first photoresist layer is formed, and insulating material of the isolation layer 52 is removed using the second photoresist pattern layer 65 as an etch mask to open the substrate in the isolation layer 52. The removal of the insulating material of the isolation layer 52 is carried out with reference to the sidewall spacers 64s. The active regions having an etching selectivity are not etched during the etching of the isolation layer 52, while portion of the substrate where the source region 63s is formed can be recessed.

However, since the insulating material of the isolation layer is removed after the formation of the sidewall spacers, the recessed portions of the active region are distant from the gate stack 62a. Therefore, leakage current in the edge portions of the channel does not occur with the present invention.

Subsequently, the second photoresist is removed and a silicide layer is formed on the source region 63s, drain region 63d and control gate by using a conventional silicidation process. The silicide layer 66 formed on the source region 63s and the isolation layer where the insulating material is removed and constitutes the common source line disposed in parallel to the word line.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A flash memory device comprising:
   an isolation layer for defining a plurality of active regions in a semiconductor substrate, each of said active regions being a region in which a plurality of flash memory cells are to be formed;
   a gate stack formed to cross the active regions and the isolation layer;

a sidewall spacer formed at sidewalls of the gate stack;
a common source line for electrically interconnecting a plurality of sources of the flash memory cells, said common source line being formed in the isolation layer by partially removing an insulating material in the isolation layer, said common source line being formed in parallel to a word line formed over the gate stack, and said common source line including a recess region having a surface lower than a face of the active region; and
a silicide layer formed on the common source line in parallel with the word line to interconnect the plurality of sources, wherein the common source line and a drain region are formed at both sides of the gate stack, and the first portion of the sidewall spacer adjacent to the common source line has a smaller thickness than a thickness of a second portion of the sidewall spacer adjacent to the drain region and wherein said silicide layer having a recess region having a surface lower than the face of the active region along the sidewall spacer adjacent to the common source line.

2. The flash memory device of claim 1, wherein the recess region is distant from the word line.

3. The flash memory device of claim 1, wherein the silicide layer electrically interconnects the isolation layer that has removed the insulating material and portions of the active region that forms the plurality of sources of the plurality of the flash memory cells.

* * * * *